US006673683B1

(12) United States Patent
Sheu et al.

(10) Patent No.: US 6,673,683 B1
(45) Date of Patent: Jan. 6, 2004

(54) DAMASCENE GATE ELECTRODE METHOD FOR FABRICATING FIELD EFFECT TRANSISTOR (FET) DEVICE WITH ION IMPLANTED LIGHTLY DOPED EXTENSION REGIONS

(75) Inventors: Yi-Ming Sheu, Hsin-chu (TW); Yi-Ling Chan, Miao-Li (TW); Da-Wen Lin, Taiping (TW); Wan-Yih Lien, Hsin-Chu (TW); Carlos H. Diaz, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/291,029

(22) Filed: Nov. 7, 2002

(51) Int. Cl.[7] .............................................. H01L 21/336

(52) U.S. Cl. ....................................... 438/287; 438/514

(58) Field of Search ................................ 438/287, 301, 438/306, 366, 369, 372, 514, 519, 527

(56) References Cited

U.S. PATENT DOCUMENTS 6,323,112 B1 * 11/2001 Lou
6,329,256 B1 12/2001 Ibok ........................... 438/299
6,348,385 B1 2/2002 Cha et al. ................... 438/287

* cited by examiner

*Primary Examiner*—Phuc T. Dang
(74) *Attorney, Agent, or Firm*—Tung & Associates

(57) ABSTRACT

A method for forming a field effect transistor device within a semiconductor product employs a patterned dummy layer first as an ion implantation mask layer when forming a pair of source/drain regions, and then as a mandrel layer for forming a pair of patterned sacrificial layers which define an aperture of linewidth and location corresponding to the patterned dummy layer. A pair of sacrificial spacer layers and a gate electrode are then formed self-aligned within the aperture. The pair of patterned sacrificial layers and the pair of sacrificial spacer layers are then stripped and the gate electrode is employed as a mask for ion implanting forming a pair of lightly doped extension regions partially overlapping the pair of source/drain regions within the semiconductor substrate.

8 Claims, 2 Drawing Sheets

26
22a
22b
20a
20b
24
12a
16a
16b
12b
10

DAMASCENE GATE ELECTRODE METHOD FOR FABRICATING FIELD EFFECT TRANSISTOR (FET) DEVICE WITH ION IMPLANTED LIGHTLY DOPED EXTENSION REGIONS

BACKGROUND OF THE INVENTION

1. Field of the Invention

The present invention relates generally to methods for fabricating field effect transistor (FET) devices. More particularly, the present invention relates to methods for fabricating field effect transistor devices with enhanced performance.

2. Description of the Related Art

Common in the semiconductor product fabrication art is the fabrication and use of field effect transistor devices. Field effect transistor devices find use as switching devices within both semiconductor logic products and semiconductor memory products.

While field effect transistor devices are thus desirable in the semiconductor product fabrication art and essential in the semiconductor product fabrication art, field effect transistor devices are nonetheless not entirely without problems.

In that regard, as semiconductor product integration levels have increased and semiconductor device dimensions have decreased, it has become increasingly important to provide methods for fabricating field effect transistor devices with enhanced performance.

It is towards the foregoing object that the present invention is directed.

Various methods have been disclosed within the semiconductor product fabrication art for fabricating field effect transistor devices with desirable properties.

Included but not limiting among the methods are methods disclosed within: (1) Ibok, in U.S. Pat. No. 6,329,256 (a damascene method for forming a gate electrode within a field effect transistor device); and (2) Cha et al., in U.S. Pat. No. 6,348,385 (a thermal out diffusion method for forming a pair of lightly doped extension regions from a pair of doped spacer layers within a field effect transistor device).

Desirable are additional methods for fabricating within semiconductor products field effect transistor devices with enhanced performance.

It is towards the foregoing object that the present invention is directed.

SUMMARY OF THE INVENTION

A first object of the invention is to provide a method for fabricating a field effect transistor device within a semiconductor product.

A second object of the invention is to provide a method in accord with the first object of the invention, wherein the field effect transistor device is fabricated with enhanced performance.

In accord with the objects of the invention, the invention provides a method for fabricating a field effect transistor device.

To practice the method of the invention, there is first provided a semiconductor substrate having formed thereover a patterned dummy layer. There is then formed within the semiconductor substrate a pair of source/drain regions while employing the patterned dummy layer as a mask. There is then formed adjoining a pair of opposite sidewalls of the patterned dummy layer a pair of patterned sacrificial layers and stripped the patterned dummy layer from adjoining the pair of patterned sacrificial layers to provide an aperture defined by the pair of patterned sacrificial layers. There is then formed adjoining a pair of sidewalls of the aperture a pair of spacer layers and formed at the bottom of the aperture a gate dielectric layer to leave remaining a partially filled aperture. There is then formed upon the pair of patterned sacrificial layers, the pair of spacer layers and the gate dielectric layer a blanket gate electrode material layer which completely fills the aperture. There is then planarized the blanket gate electrode material layer, the pair of patterned sacrificial layers and the pair of spacer layers to form a gate electrode, a pair of planarized patterned sacrificial layers and a pair of planarized spacer layers having a pair of blunt tips. There is then stripped the pair of planarized patterned sacrificial layers and the pair of planarized spacer layers from the gate electrode. Finally, there is then implanted, while employing the gate electrode as a mask, a pair of lightly doped extension regions into the semiconductor substrate.

The invention provides a method for fabricating a field effect transistor device within a semiconductor product, wherein the field effect transistor device is fabricated with enhanced performance.

The invention realizes the foregoing object by: (1) forming within the field effect transistor device a pair of source/drain regions prior to forming a pair of lightly doped extensions regions (such that the pair of lightly doped extension regions may be formed absent exposure to a thermal annealing employed incident to forming the pair of source/drain regions); and (2) forming the pair of lightly doped extension regions while employing an ion implant method (such as to provide superior dimensional control of the location and composition of the pair of lightly doped extension regions).

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a field effect transistor device within a semiconductor product, wherein the field effect transistor device is fabricated with enhanced performance.

The invention realizes the foregoing object by: (1) forming within the field effect transistor device a pair of source/drain regions prior to forming a pair of lightly doped extension regions (such that the pair of lightly doped extension regions may be formed absent exposure to a thermal annealing employed incident to forming the pair of source/drain regions); and (2) forming the pair of lightly doped extension regions while employing an ion implant method (such as to provide superior dimensional control of the location and composition of the pair of lightly doped extension regions).

While the preferred embodiment of the invention illustrates the invention within the context of forming a single field effect transistor device of a single polarity within a semiconductor product, given appropriate additional masking and additional doping (of complementary polarity) the present invention may also be employed for forming complementary field effect transistor devices within semiconductor products.

FIG. 1 to FIG. 10 show a series of schematic cross-sectional diagrams illustrating the results of progressive stages of fabricating a field effect transistor device within a semiconductor product in accord with a preferred embodiment of the invention.

Figure 1:
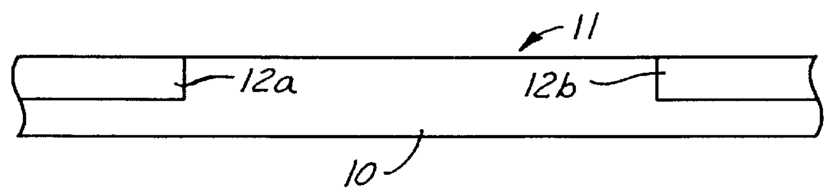
FIG. 1, FIG. 2, FIG. 3, FIG. 4, FIG. 5, FIG. 6, FIG. 7, FIG. 8, FIG. 9 and FIG. 10 show a series of schematic cross-sectional diagrams illustrating the results of progressive stages of fabricating a field effect transistor device within a semiconductor product in accord with a preferred embodiment of the invention.

FIG. 1 shows a schematic cross-sectional diagram of the semiconductor product at an early stage of fabrication therein of the field effect transistor device.

FIG. 1 shows a semiconductor substrate 10 having formed therein a pair of isolation regions 12*a* and 12*b* which define an active region 11 of the semiconductor substrate 10.

Although semiconductor substrates are known with either dopant polarity, several dopant concentrations and various crystallographic orientations, for the preferred embodiment of the invention, the semiconductor substrate 10 is typically a (100) silicon semiconductor substrate having either an N- or P- dopant concentration. In addition, although isolation regions of various materials and configurations are also known in the semiconductor product fabrication art, for the preferred embodiment of the invention the pair of isolation regions 12*a* and 12*b* is typically formed as a pair of shallow trench isolation (STI) regions.

Figure 2:
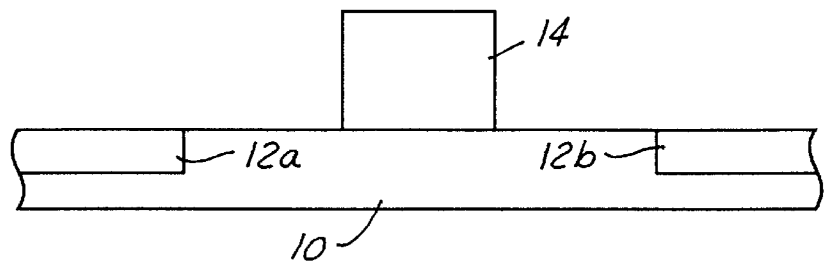

FIG. 2 shows the results of further processing of the semiconductor product of FIG. 1.

FIG. 2 shows a patterned dummy layer 14 formed upon and nominally centered within the active region 11 of the semiconductor substrate 10.

Within the invention, the patterned dummy layer 14 is formed of a linewidth equal to the sum of a gate electrode linewidth plus a pair of spacer layer linewidths which adjoin the gate electrode linewidth. Typically, the patterned dummy layer 14 is formed of a linewidth from about 0.10 to about 0.20 microns. Typically, the patterned dummy layer 14 is also formed to a thickness of from about 2000 to about 4000 angstroms. While the patterned dummy layer 14 may be formed from any of several materials, including but not limited to conductor materials, semiconductor materials and dielectric materials, for the preferred embodiment of the invention the patterned dummy layer 14 is typically and preferably formed of a silicon oxide material.

Figure 3:
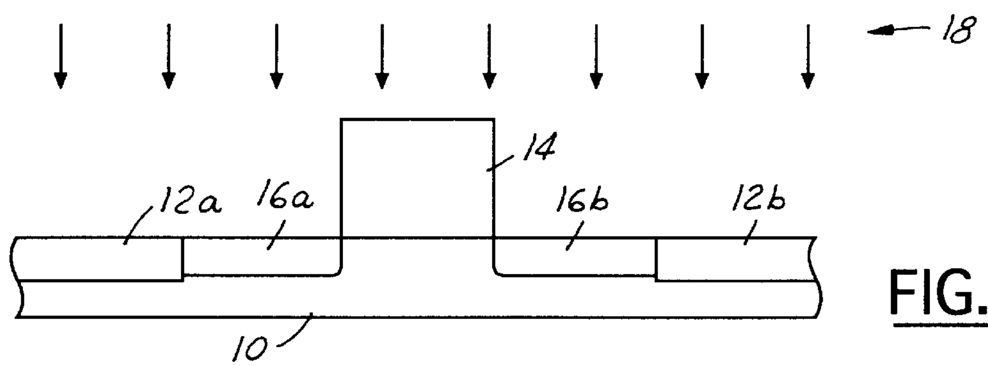

FIG. 3 shows the results of further processing of the semiconductor product of FIG. 2.

FIG. 3 shows the results of forming a pair of source/drain regions 16*a* and 16*b* into the active region 11 of the semiconductor substrate 10 while employing the patterned dummy layer 14 as a mask. The pair of source/drain regions 16*a* and 16*b* is formed through implanting a dose of first dopant implanting ions 18.

Within the invention, the dose of first dopant implanting ions 18 is selected of appropriate polarity, concentration and energy such as to provide the pair of source/drain regions 16*a* and 16*b* of dopant concentration from about 1E18 to about 1E20 dopant atoms per cubic centimeters. Typically, the pair of source/drain regions 16*a* and 16*b* is thermally annealed at a temperature of from about 900 to about 1100 degrees centigrade for a time period of from about 1 to about 3 hours, such as to repair ion implant damage within the pair of source/drain regions 16*a* and 16*b*.

Figure 4:
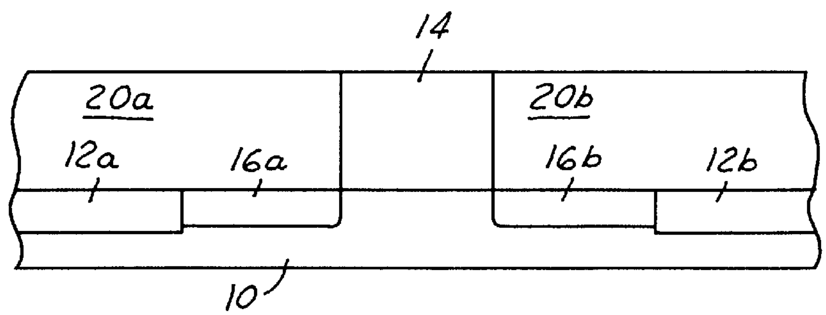

FIG. 4 shows the results of further processing of the semiconductor product of FIG. 3.

FIG. 4 shows the results of forming a pair of patterned sacrificial layers 20*a* and 20*b* adjoining a pair of opposite sidewalls of the patterned dummy layer 14.

Within the invention, the pair of patterned sacrificial layers 20*a* and 20*b* is typically formed employing a planarizing method, and in particular a chemical mechanical polish (CMP) planarizing method, while employing the patterned dummy layer 14 as a planarizing stop layer. Thus, the pair of patterned sacrificial layers 20*a* and 20*b* is formed of the same thickness as the patterned dummy layer 14, with no portion of the pair of patterned sacrificial layers 20*a* and 20*b* extending over the patterned dummy layer 14. Although the pair of patterned sacrificial layers 20*a* and 20*b* may be formed from any of several materials, including but not limited to conductor materials, semiconductor materials and dielectric materials, for ease of processing within the preferred embodiment of the invention the pair of patterned sacrificial layers 20*a* and 20*b* is typically formed of a silicon nitride material.

Figure 5:
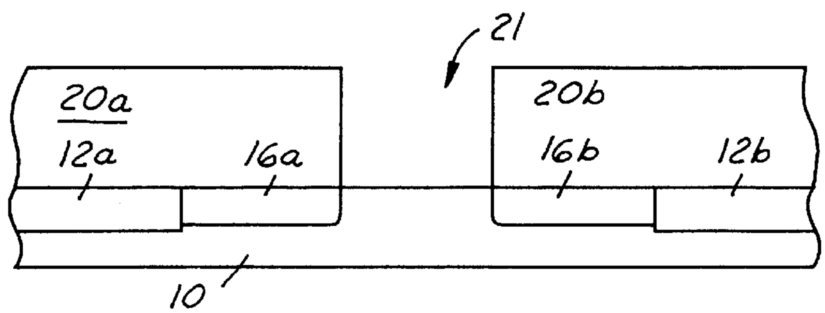

FIG. 5 shows the results of further processing of the semiconductor product of FIG. 4.

FIG. 5 shows the results of stripping from adjoining and interposed between the pair of patterned sacrificial layers 20*a* and 20*b* the patterned dummy layer 14 to thus form an aperture 21 defined by the pair of patterned sacrificial layers 20*a* and 20*b*. The aperture 21 inherently has a linewidth the same as the patterned dummy layer 14.

Within the invention, the patterned dummy layer 14 may be stripped from interposed between and adjoining the pair of patterned sacrificial layers 20*a* and 20*b* while employing an etchant as is otherwise conventional in the microelectronic product fabrication art. Under circumstances where the patterned dummy layer 14 is formed of a silicon oxide material, the patterned dummy layer 14 may be stripped employing an aqueous hydrofluoric acid containing etchant solution.

Figure 6:
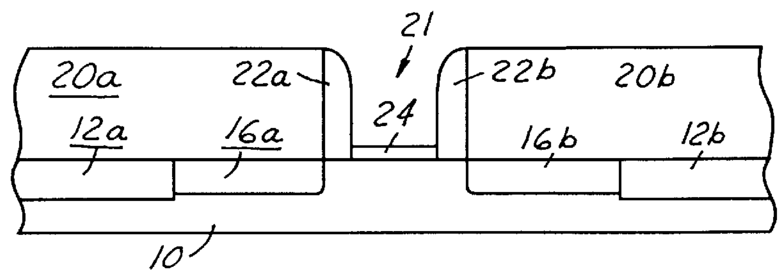

FIG. 6 shows the results of further processing of the semiconductor product of FIG. 5.

FIG. 6 shows the results of forming: (1) a pair of spacer layers 22*a* and 22*b* upon a pair of sidewalls of the pair of patterned sacrificial layers 20*a* and 20*b* within the aperture 21 defined by the pair of patterned sacrificial layers 20*a* and 20*b*; and (2) a gate dielectric layer 24 upon the semiconductor substrate 10 at the bottom of the aperture 21, to thus provide an incompletely filled aperture 21'.

Within the invention, the pair of spacer layers 22*a* and 22*b* may be formed employing an anisotropic etching of a blanket spacer material layer, as is otherwise generally conventional in the microelectronic product fabrication art. Typically, the pair of spacer layers 22*a* and 22*b* is formed of a silicon oxide material. In addition, the gate dielectric layer 24 may be formed of gate dielectric materials as are conventional in the semiconductor product fabrication art and will generally include silicon oxide containing materials. While FIG. 6 illustrates the gate dielectric layer 24 as a patterned gate dielectric layer implicitly generally being formed employing a thermal oxidation growth method, gate dielectric layers formed employing deposition methods (to provide the gate dielectric layers as blanket gate dielectric layers) may also be employed within the present invention.

Figure 7:
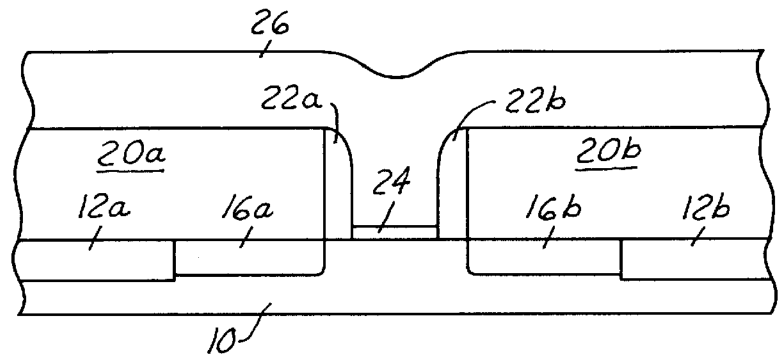

FIG. 7 shows the results of further processing of the semiconductor product of FIG. 6.

FIG. 7 shows a blanket gate electrode material layer 26 formed upon exposed portions of the pair of patterned sacrificial layers 20*a* and 20*b*, the pair of spacer layers 22*a* and 22*b* and the gate dielectric layer 24 and completely filling the aperture 21.

Within the invention, the blanket gate electrode material layer 26 may be formed of gate electrode materials as are conventional in the semiconductor product fabrication art, including in particular doped polysilicon (having a dopant concentration of greater than about 1E18 dopant atoms per cubic centimeter) and polycide (doped polysilicon/metal silicide stack) gate electrode materials.

Figure 8:
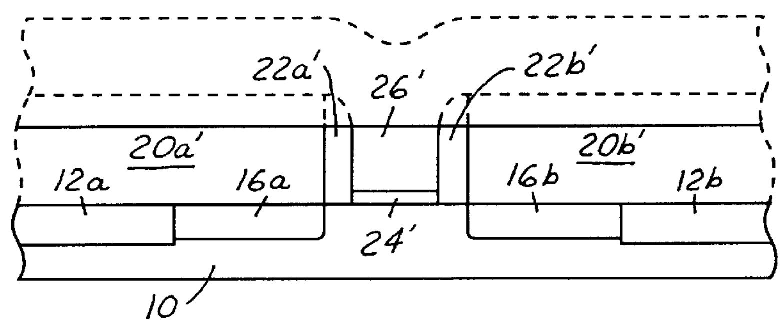

FIG. 8 shows the results of further processing of the semiconductor product of FIG. 7.

FIG. 8 shows the results of planarizing the blanket gate electrode material layer 26, the pair of spacer layers 22*a* and 22*b* and the pair of patterned sacrificial layers 20*a* and 20*b*, to form a corresponding gate electrode 26' interposed between and adjoining a pair of planarized spacer layers 22*a*' and 22*b*' further interposed between and adjoining a pair of planarized patterned sacrificial layers 20*a*' and 20*b*'. As is illustrated within FIG. 8, the pair of spacer layers 22*a* and 22*b* when planarized yield the pair of planarized spacer layers 22*a*' and 22*b*' having a pair of blunt tips which provide the pair of planarized spacer layers 22*a*' and 22*b*' of nominally uniform sidewall thickness (of from about 100 to about 500 angstroms). Typically, the planarizing of the pair of patterned sacrificial layers 20*a* and 20*b* and the pair of spacer layers 22*a* and 22*b* removes therefrom a thickness (in the vertical direction) of from about 500 to about 1000 angstroms when forming therefrom the pair of planarized patterned sacrificial layers 20*a*' and 20*b*' and the pair of planarized spacer layers 22*a*' and 22*b*'. In addition, within the invention the gate electrode 26' may be formed of a linewidth less than a minimum photolithographically resolvable linewidth, since it is formed in a self aligned fashion while employing a modified damascene method.

Within the invention, the planarizing of the blanket gate electrode material layer 26, the pair of spacer layers 22*a* and 22*b* and the pair of patterned sacrificial layers 20*a* and 20*b* to form the corresponding gate electrode 26', pair of planarized spacer layers 22*a*' and 22*b*' and pair of planarized patterned sacrificial layers 20*a*' and 20*b*' is typically and preferably undertaken employing a chemical mechanical polish (CMP) planarizing method. Typically, an endpoint within the chemical mechanical polish planarizing method is determined as a time based over-planarization after reaching the pair of patterned sacrificial layers 20*a* and 20*b* as a pair of stop layers.

Although not specifically illustrated within FIG. 8, the gate electrode 26' may if not previously having been doped now be doped via ion implantation. Such a processing step is often common when fabricating gate electrodes of different dopant polarities for use within complementary field effect transistor devices. The presence of the planarized spacer layers 22*a*' and 22*b*' having blunted tips provides for enhanced physical integrity of the gate electrode 26' when doped via ion implantation.

Figure 9:
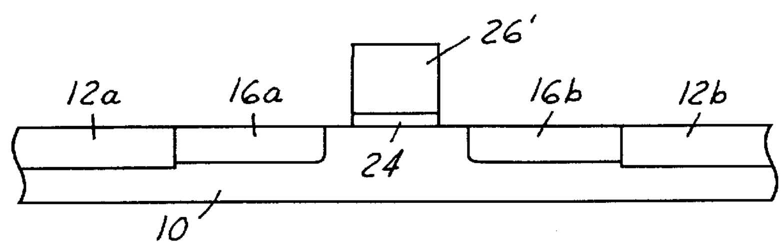

FIG. 9 shows the results of further processing of the semiconductor product of FIG. 8.

FIG. 9 illustrates the results of stripping: (1) the pair of planarized patterned sacrificial layers 20*a*' and 20*b*' from adjoining the pair of planarized spacer layers 22*a*' and 22*b*'; and (2) the pair of planarized spacer layers 22*a*' and 22*b*' from adjoining the gate electrode 26'.

The pair of planarized patterned sacrificial layers 20*a*' and 20*b*' and the pair of planarized spacer layers 22*a*' and 22*b*' may be stripped employing methods and materials as are conventional in the semiconductor product fabrication art. Such methods will generally include aqueous hydrofluoric acid etchant materials for stripping microelectronic layers formed of silicon oxide materials and aqueous phosphoric acid materials for stripping microelectronic layers formed of silicon nitride materials.

Figure 10:
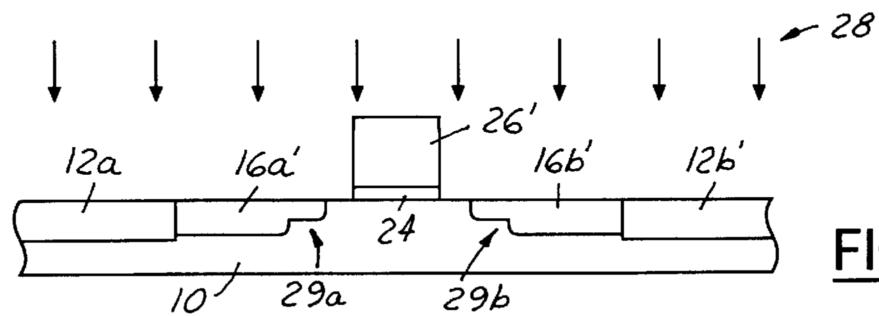

FIG. 10 shows the results of further processing of the semiconductor product of FIG. 9.

FIG. 10 shows the results of forming a pair of lightly doped extension regions 29*a* and 29*b* within the active region of the semiconductor substrate 10 while employing the gate electrode 26' as a mask. The pair of lightly doped extension regions 29*a* and 29*b* is formed while employing a dose of second dopant implanting ions 28. The pair of lightly doped extension regions 29*a* and 29*b* overlaps in part the pair of source/drain regions 16*a* and 16*b* to thus provide a pair of source/drain regions incorporating lightly doped extension regions 16*a*' and 16*b*'.

Within the invention, the pair of source/drain regions incorporating lightly doped extension regions 16*a*' and 16*b*' is formed employing the dose of second dopant implanting ions 28 which provides the pair of lightly doped extension regions of dopant concentration from about 1E13 to about 1E15 dopant atoms per cubic centimeter. As is understood by a person skilled in the art, by employing an ion implant method to form the lightly doped extension regions 29*a* and 29*b* within the pair of source/drain regions incorporating lightly doped extension regions 16*a*' and 16*b*', the pair of lightly doped extension regions 29*a* and 29*b* is formed with enhanced dimensional control (in comparison with thermal diffusion methods) and thus the field effect transistor device as illustrated within FIG. 10 is fabricated with enhanced performance. Such enhanced dimensional control provides that the pair of lightly doped extension regions 29*a* and 29*b* within the pair of source/drain regions incorporating lightly doped extension regions 16*a*' and 16*b*' may be formed of a junction depth of from about 50 to about 100 angstroms.

The field effect transistor device as illustrated in FIG. 10 may be further fabricated employing methods as are conventional in the semiconductor product fabrication art, such as to provide additional spacer layers (adjoining the gate electrode 26') and salicide silicide layers (upon the source/drain regions incorporating lightly doped extension regions 16*a*' and 16*b*' and gate electrode 26') as are conventional in the art.

FIG. 1 to FIG. 10 illustrate progressive stages within a method for fabricating a field effect transistor device with enhanced performance, in accord with a preferred embodiment of the invention. The invention realizes the foregoing object by: (1) forming within the field effect transistor device a pair of source/drain regions prior to forming a pair of lightly doped extensions regions (such that the pair of lightly doped extension regions may be formed absent exposure to a thermal annealing employed incident to forming the pair of source/drain regions); and (2) forming the pair of lightly doped extension regions while employing an ion implant method (such as to provide superior dimensional control of the location and composition of the pair of lightly doped extension regions). The present invention also provides a damascene method for forming a gate electrode with linewidth narrower than a minimal photolithographically resolvable linewidth.

As is understood by a person skilled in the art, the preferred embodiment of the invention is illustrative of the invention rather than limiting of the invention. Revisions and modifications may be made to materials, structures and dimensions in accord with the preferred embodiment of the invention while still providing a method for fabricating a field effect transistor device in accord with the present invention, further in accord with the accompanying claims.

What is claimed is:

1. A method for fabricating a field effect transistor device comprising:

providing a semiconductor substrate having formed thereover a patterned dummy layer;

forming within the semiconductor substrate a pair of source/drain regions while employing the patterned dummy layer as a mask;

forming adjoining a pair of opposite sidewalls of the patterned dummy layer a pair of patterned sacrificial layers and stripping the patterned dummy layer from adjoining the pair of patterned sacrificial layers to provide an aperture defined by the pair of patterned sacrificial layers;

forming adjoining a pair of sidewalls of the aperture a pair of spacer layers and forming at the bottom of the aperture a gate dielectric layer to leave remaining a partially filled aperture;

forming upon the pair of patterned sacrificial layers, the pair of spacer layers and the gate dielectric layer a blanket gate electrode material layer which completely fills the aperture;

planarizing the blanket gate electrode material layer, the pair of patterned sacrificial layers and the pair of spacer layers to form a gate electrode, the pair of planarized patterned sacrificial layers and the pair of planarized spacer layers having a pair of blunt tips;

stripping the pair of planarized patterned sacrificial layers and the pair of planarized spacer layers from the gate electrode; and implanting, while employing the gate electrode as a mask, a pair of lightly doped extension regions into the semiconductor substrate.

2. The method of claim 1 wherein the patterned dummy layer is formed of a linewidth equal to the sum of the linewidths of the gate electrode and the pair of spacer layers.

3. The method of claim 1 wherein the patterned dummy layer is formed to a thickness of from about 2000 to about 4000 angstroms.

4. The method of claim 1 wherein the pair of patterned sacrificial layers is formed of the same thickness as the patterned dummy layer.

5. The method of claim 1 wherein the pair of patterned sacrificial layers is formed employing a planarizing method which employs the patterned dummy layer as a stop layer.

6. The method of claim 1 wherein the patterned dummy layer is formed of a silicon oxide material and the pair of patterned sacrificial layers is formed of a silicon nitride material.

7. The method of claim 1 wherein said planarizing step comprises a removal of a thickness of from about 500 to about 1000 angstroms.

8. The method of claim 1 wherein the pair of lightly doped extension regions is formed to a junction depth of from about 50 to about 100 angstroms.

* * * * *